(12) United States Patent
Romano

(10) Patent No.: US 10,323,923 B2
(45) Date of Patent: Jun. 18, 2019

(54) RESISTIVE TELEMETRY SYSTEM AND METHOD

(71) Applicant: COM DEV Ltd., Mississauga (CA)

(72) Inventor: Antonio Romano, Cambridge (CA)

(73) Assignee: COM DEV LTD., Mississauga (CA)

( * ) Notice: Subject to any disclaimer, the term of this patent is extended or adjusted under 35 U.S.C. 154(b) by 240 days.

(21) Appl. No.: 15/384,832

(22) Filed: Dec. 20, 2016

(65) Prior Publication Data

US 2018/0172419 A1  Jun. 21, 2018

(51) Int. Cl.
*G01B 7/00* (2006.01)
*H04Q 9/00* (2006.01)
*H04Q 1/24* (2006.01)
*G01R 27/02* (2006.01)

(52) U.S. Cl.
CPC .............. *G01B 7/003* (2013.01); *H04Q 1/24* (2013.01); *H04Q 9/00* (2013.01); *G01R 27/02* (2013.01)

(58) Field of Classification Search
CPC ............ G01B 7/003; H04Q 1/24; H04Q 9/00; G01R 27/02
USPC .................. 324/600, 649, 691, 693
See application file for complete search history.

(56) References Cited

U.S. PATENT DOCUMENTS

| | | | |
|---|---|---|---|
| 4,145,687 A | 3/1979 | Masuda | |
| 6,542,835 B2 | 4/2003 | Mundt | |
| 2005/0094490 A1 | 5/2005 | Thomenius et al. | |
| 2008/0258950 A1 | 10/2008 | Griffin | |
| 2017/0060150 A1* | 3/2017 | Stefanski | G05D 23/27 |
| 2017/0300051 A1* | 10/2017 | Zhou | G01S 19/14 |
| 2018/0036740 A1* | 2/2018 | Nelson | B02C 19/18 |
| 2018/0059176 A1* | 3/2018 | Ding | G01R 1/0433 |
| 2018/0179840 A1* | 6/2018 | Varkey | E21B 23/01 |
| 2018/0269552 A1* | 9/2018 | Vendier | H01P 1/127 |

FOREIGN PATENT DOCUMENTS

DE       2523912 A1    12/1976

OTHER PUBLICATIONS

Extended European Search Report dated May 3, 2018 in corresponding EP Patent Application No. 17196043.8.

* cited by examiner

*Primary Examiner* — Giovanni Astacio-Oquendo
(74) *Attorney, Agent, or Firm* — Bereskin & Parr LLP/S.E.N.C.R.L., s.r.l.; Iris E. Caulder; T. Cameron Gale

(57) ABSTRACT

A telemetry system with a matrixed telemetry switch unit array and a method for determining the switch position of a telemetry switch unit. The switch units include steering diodes and parallel signal paths each with unique resistance values. The signal paths correspond to switch positions and are closed when the switch unit is in the corresponding switch position. A signal source is electrically connected to an input current path and output current path of the array with a corresponding telemetry switch unit coupled into the signal path. A plurality of sensing signals are applied through the array and the resultant signals are measured. The switch position is determined from the resultant signals indicating the resistance value of the switch signal path currently coupled into the array signal path while accounting for the voltage drop of the steering diodes.

15 Claims, 6 Drawing Sheets

RESISTIVE TELEMETRY SYSTEM AND METHOD

FIELD

The present subject-matter relates generally to telemetry, and more particularly to resistive telemetry with a matrix topology.

INTRODUCTION

The following is not an admission that anything discussed below is part of the prior art or part of the common general knowledge of a person skilled in the art.

Telemetry relates to the collection of data and/or measurements from remote components. For example, telemetry may be used to collect data from monitored components such as sensors. Telemetry may also be used to provide feedback on the current state or operating conditions of monitored components. For example, telemetry may be used to monitor the switch positions of a plurality of switches in a switching network.

Telemetry signals can be collected using signal wires running between a controller and telemetry units corresponding to each of the monitored components. Each telemetry unit may have a telemetry switch with multiple switch positions that correspond to different measured values and/or operating conditions of the monitored component. The switch position of a telemetry switch unit can change depending on the state of the monitored component. Telemetry signals may be used to detect the telemetry switch position, and in turn determine the state of the monitored component.

SUMMARY

This summary is intended to introduce the reader to the more detailed description that follows and not to limit or define any claimed or as yet unclaimed invention. One or more inventions may reside in any combination or sub-combination of the elements or process steps disclosed in any part of this document including its claims and figures.

In general, the present application relates to a telemetry system with a matrixed telemetry switch unit array and methods for determining the switch position of a telemetry switch unit. The switch units can include steering diodes and parallel switch signal paths each with unique resistance values. The switch signal paths correspond to switch positions and are closed when the switch unit is in the corresponding switch position. A signal source can be electrically connected to an input current path and output current path of the array with a corresponding telemetry switch unit coupled into the array signal path. A plurality of sensing signals can be applied through the array and the resultant signals can be measured. The switch position can determined from the resultant signals indicating the resistance value of the switch signal path currently coupled into the array signal path while accounting for the voltage drop of the steering diodes.

The embodiments described herein provide in a first broad aspect a method for determining a particular switch position of a particular telemetry switch unit within a telemetry switch array. The switch array can include a plurality of telemetry switch units. Each telemetry switch unit can have a switch current input, a switch current output, a plurality of switch positions and at least one isolation diode in a current path between the switch current input and the switch current output. The array can include a plurality of input current paths with each input current path coupled to the switch current input of a first plurality of telemetry switch units from the plurality of telemetry switch units. The array can also include a plurality of output current paths with each output current path coupled to the switch current output of a second plurality of telemetry switch units from the plurality of telemetry switch units. The method can include applying a plurality of electrical sensing signals to an array current path of the telemetry switch array. The array current path can be defined from a particular input current path to a particular output current path through the current path of the particular telemetry switch unit. Each electrical sensing signal can have a different signal level. The method can also include measuring a plurality of resultant electrical signals across the array current path, with each measured resultant electrical signal corresponding to one of the electrical sensing signal; and determining the particular switch position of the particular telemetry switch unit from the plurality of measured resultant electrical signal where the plurality of measured resultant electrical signal correspond to a resistance value of a resistive component coupled into the current path through the particular telemetry switch unit.

In some embodiments, the method may include determining the particular switch position by determining at least one signal value for the array current path from the plurality of measured resultant electrical signals; and determining the particular switch position by comparing each signal value to at least one switch threshold signal value stored for the particular telemetry switch unit.

In some embodiments, the at least one switch threshold signal value stored for the particular telemetry switch unit may include a plurality of switch threshold signal values defining a plurality of threshold signal ranges. The method may further include measuring the plurality of measured resultant electrical signals to include a first measured resultant electrical signal and a second measured resultant electrical signal; determining the at least one signal value as a signal difference between the first measured resultant electrical signal and the second measured resultant electrical signal; identifying a particular threshold signal range by comparing the signal difference to the plurality of switch threshold signal values stored for the particular telemetry switch unit; and determining the particular switch position as a switch position corresponding to a position-specific resistance value that corresponds to the particular threshold signal range.

In some embodiments, the method may further include determining the at least one signal value to include a plurality of signal values, with each measured resultant electrical signal defining one of the signal values; defining a plurality of signal threshold markers by comparing each signal value to the at least one threshold signal value stored for the particular telemetry switch unit where the plurality of signal threshold markers include a signal threshold marker for each signal value; and determining the particular switch position from the plurality of signal threshold markers.

In some embodiments, the method may further include determining a threshold marker sequence from the plurality of signal threshold markers, with each signal threshold marker defining one of the threshold markers in the sequence; and determining the particular switch position using the threshold marker sequence and a plurality of stored marker relationships, with each marker relationship defining a relationship between a particular sequence of threshold markers and a switch position.

In some embodiments, the number of measured resultant electrical signals in the plurality of measured resultant electrical signals may correspond to the number of switch positions of the particular telemetry switch unit.

The embodiments described herein provide in another aspect a telemetry system. The telemetry system can have a telemetry switch array, an electrical signal source and a controller. The telemetry switch array can include a plurality of telemetry switch units, a plurality of input current paths, and a plurality of output current paths. Each telemetry switch unit can have a switch current input, a switch current output, a plurality of switch positions and at least one isolation diode in a current path between the switch current input and the switch current output. Each switch position may define the current path as a position-specific current path with a resistive component coupled into the current path between the switch current input and the switch current output where the resistive component for each switch position has a position-specific resistance value. Each input current path can be coupled to the switch current input of a first plurality of telemetry switch units from the plurality of telemetry switch units, and the switch current input of each telemetry switch unit can be coupled to one of the input current paths. Each output current path can be coupled to the switch current output of a second plurality of telemetry switch units from the plurality of telemetry switch units, and the switch current output of each telemetry switch unit can be coupled to one of the output current paths. The electrical signal source can be electrically connectable to each of the input current paths and each of the output current paths. The electrical signal source may be operable to provide a plurality of electrical sensing signals to an array current path defined from a particular input current path to a particular output current path through the current path of a particular telemetry switch unit. The controller may be operable to measure a plurality of measured resultant electrical signals across the array current path, with each measured resultant electrical signal being associated with an electrical sensing signal having a different signal level; and determine the switch position of the particular telemetry switch unit from the plurality of measured resultant electrical signals where the plurality of measured resultant electrical signals correspond to a particular resistance value of a particular resistive component coupled into the current path through the particular telemetry switch unit.

In some embodiments, the system may further include a storage component. The storage component can store at least one threshold signal, with each telemetry switch unit having a corresponding at least one switch threshold signal value in the at least one threshold signal value. The controller may be operable to determine the switch position by determining at least one signal value for the array current path from the plurality of measured resultant electrical signals; and determining the switch position by comparing each signal value to the at least one switch threshold signal value for the particular telemetry switch unit.

In some embodiments, the at least one switch threshold signal value corresponding to the particular telemetry switch unit may include a plurality of switch threshold signal values defining a plurality of threshold signal ranges with each threshold signal range corresponding to one of the position-specific resistance values for the particular telemetry switch unit. The controller may be operable to measure the plurality of measured resultant electrical signals to include a first measured resultant electrical signal and a second measured resultant electrical signal; determine the at least one signal value as a signal difference between the first measured resultant electrical signal and the second measured resultant electrical signal; identify one of the threshold signal ranges by comparing the signal difference to the plurality of switch threshold signal values stored for the particular telemetry switch unit; and determine the switch position as a particular switch position corresponding to the particular position-specific resistance value that corresponds to the identified threshold voltage range.

In some embodiments, the controller may be operable to determine the at least one signal value to include a plurality of signal values, with each measured resultant electrical signal defining one of the signal values; define a plurality of signal threshold markers by comparing each signal value to the at least one threshold signal value stored in the storage component with the plurality of signal threshold markers including a signal threshold marker for each signal value; and determine the switch position from the plurality of signal threshold markers.

In some embodiments, the storage component can store a plurality of marker relationships, with each marker relationship defining a relationship between a particular sequence of threshold markers and a particular switch position. The controller may be operable to determine a threshold marker sequence from the plurality of signal threshold markers, with each signal threshold marker defining one of the threshold markers in the sequence; and determine the switch position as one of the particular switch positions using the threshold marker sequence and the stored marker relationships.

In some embodiments, controller may be operable to measure the plurality of measured resultant electrical signals to include a number of measured resultant electrical signals that corresponds to the number of switch positions of the particular telemetry switch unit.

In some embodiments, the position-specific resistance values for the particular telemetry switch unit can be defined so that each position-specific resistance value is about two times or greater than the value of the next lowest position-specific resistance value.

In some embodiments, at least one of the telemetry switch units may include a plurality of isolation diodes in the current path.

In some embodiments, for each telemetry switch unit, the position-specific resistance values corresponding to the plurality of switch positions can be the same.

It will be appreciated by a person skilled in the art that a telemetry system and/or method may include any one or more of the features contained herein and that the features may be used in any particular combination or sub-combination suitable for a telemetry system and/or method.

DRAWINGS

For a better understanding of the embodiments described herein and to show more clearly how they may be carried into effect, reference will now be made, by way of example only, to the accompanying drawings which show at least one exemplary embodiment, and in which.

DESCRIPTION OF VARIOUS EMBODIMENTS

Figure 1:
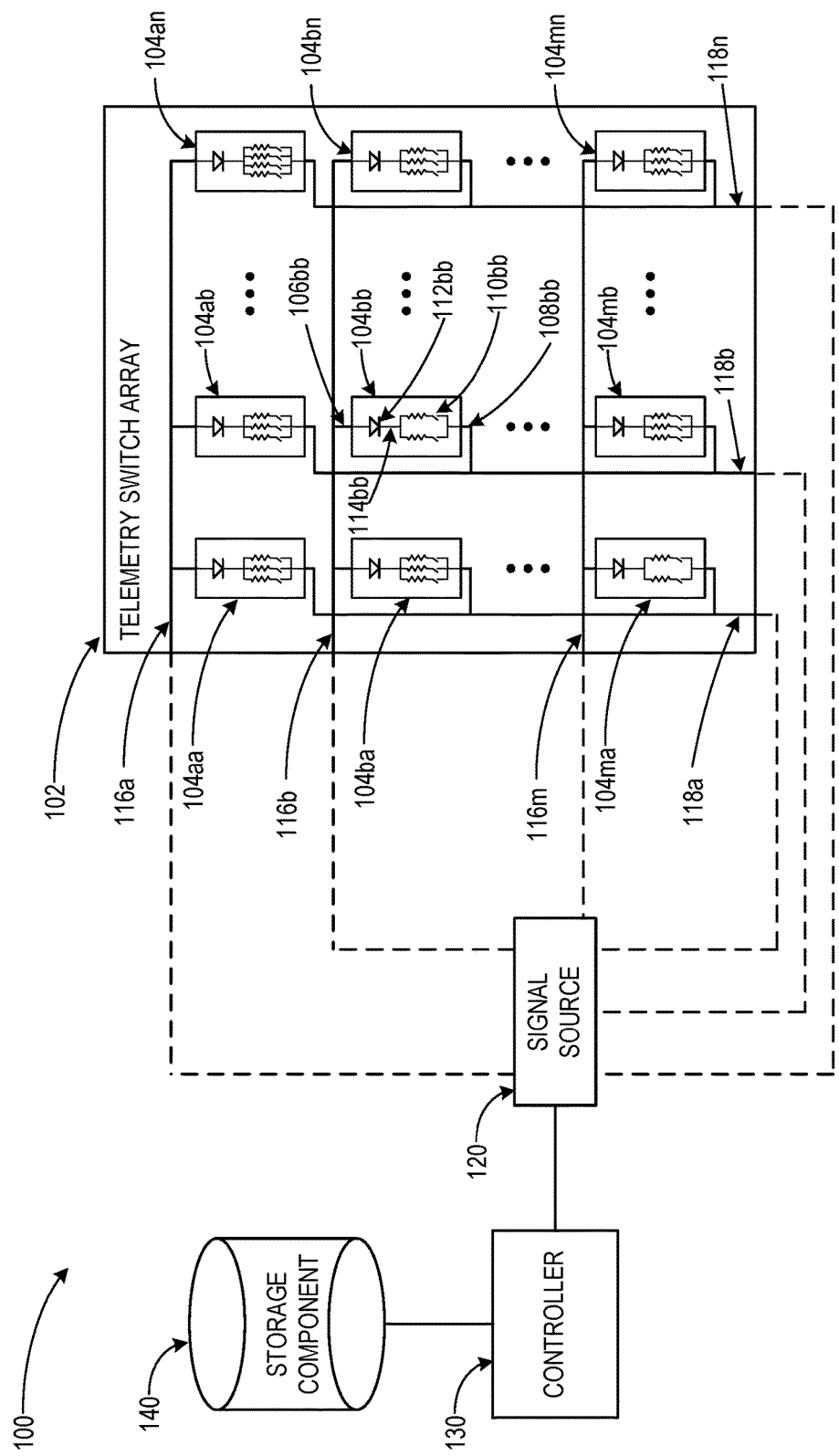
FIG. 1 illustrates an example of a telemetry system in accordance with an example embodiment.

It will be appreciated that, for simplicity and clarity of illustration, where considered appropriate, reference numerals may be repeated among the figures to indicate corresponding or analogous elements or steps. In addition, numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way but rather as merely describing the implementation of the various embodiments described herein.

It should also be noted that the terms "coupled" or "coupling" as used herein can have several different meanings depending in the context in which these terms are used. For example, the terms coupled or coupling may be used to indicate that an element or device can electrically, optically, or wirelessly send data to another element or device as well as receive data from another element or device.

It should be noted that terms of degree such as "substantially", "about" and "approximately" as used herein mean a reasonable amount of deviation of the modified term such that the end result is not significantly changed. These terms of degree may also be construed as including a deviation of the modified term if this deviation would not negate the meaning of the term it modifies.

Furthermore, any recitation of numerical ranges by endpoints herein includes all numbers and fractions subsumed within that range (e.g. 1 to 5 includes 1, 1.5, 2, 2.75, 3, 3.90, 4, and 5). It is also to be understood that all numbers and fractions thereof are presumed to be modified by the term "about" which means a variation of up to a certain amount of the number to which reference is being made if the end result is not significantly changed.

The example embodiments of the systems and methods described herein may be implemented as a combination of hardware or software. In some cases, the example embodiments described herein may be implemented, at least in part, by using one or more computer programs, executing on one or more programmable devices comprising at least one processing element, and a data storage element (including volatile memory, non-volatile memory, storage elements, or any combination thereof). These devices may also have at least one input device (e.g. a pushbutton keyboard, mouse, a touchscreen, and the like), and at least one output device (e.g. a display screen, a printer, a wireless radio, and the like) depending on the nature of the device.

It should also be noted that there may be some elements that are used to implement at least part of one of the embodiments described herein that may be implemented via software that is written in a high-level computer programming language such as object oriented programming. Accordingly, the program code may be written in C, C++ or any other suitable programming language and may comprise modules or classes, as is known to those skilled in object oriented programming. Alternatively, or in addition thereto, some of these elements implemented via software may be written in assembly language, machine language or firmware as needed. In either case, the language may be a compiled or interpreted language.

At least some of these software programs may be stored on a storage media (e.g. a computer readable medium such as, but not limited to, ROM, magnetic disk, optical disc) or a device that is readable by a general or special purpose programmable device. The software program code, when read by the programmable device, configures the programmable device to operate in a new, specific and predefined manner in order to perform at least one of the methods described herein.

Furthermore, at least some of the programs associated with the systems, devices and methods of the embodiments described herein may be capable of being distributed in a computer program product comprising a computer readable medium that bears computer usable instructions for one or more processors. The medium may be provided in various forms, including non-transitory forms such as, but not limited to, flash drives, one or more diskettes, compact disks, tapes, and magnetic and electronic storage.

Telemetry can be used to retrieve sensor measurements, operating conditions and other data from components, such as sensors or switches, which are remote from a controller. Embodiments described herein relate to telemetry systems having one or more telemetry switch units each of which has multiple switch positions. The switch positions of the telemetry switch units correspond to data and/or operating conditions from the components being monitored. Each telemetry switch unit may be coupled to a corresponding monitored component, such as a sensor or RF switch for example. The telemetry switch unit may be configured to change its switch position to reflect the current state of, or data collected by, the monitored component.

In one example embodiment, telemetry switches can be used to monitor RF switching networks such as those that may be used on spacecraft. A switching network can include a series of switches, e.g. mechanical microwave switches, used to interconnect user-selected RF ports that are under remote electrical control. The switching network may serve to re-route communications in the event of a failure or to provide connectivity between any number of RF inputs and outputs.

A controller may be used to actuate each of the RF switches. The controller may also read back position telemetry corresponding to the RF switch to determine the current position of the RF switch. The controller may determine the current switch position of an RF switch by reading and analyzing telemetry signals corresponding to that RF switch.

Each RF switch may have a corresponding telemetry switch unit. Each telemetry switch unit can have a plurality of telemetry switch positions. Each telemetry switch position can be associated with an RF switch position of the corresponding RF switch. For example, each switch position of the RF switch may have a corresponding switch (e.g. a magnetically actuated reed-switch) in the corresponding telemetry switch unit. The reed-switch in the telemetry switch unit may be toggled closed when the RF switch toggles to the corresponding switch position.

The monitored components (e.g. RF switches) and corresponding telemetry switch units may be coupled to a controller in various ways. For example, each telemetry switch unit may have a separate telemetry signal pin/wire for each switch position and a common return path/wire. The switch position of the telemetry switch unit may be determined by identifying the telemetry signal pin currently coupled to the return path for the switching unit. However, as the number of monitored components increases, this can result in a large number of wires between the controller and the telemetry switch units, particularly if each switch unit has many switch positions.

In an alternative approach, as in embodiments herein, each telemetry switch unit may have a common input signal path and a common return path. Each telemetry switch unit may include a plurality of resistive components, each with a different resistance value. Each resistive component can be positioned in a different switch-position-specific signal path through the telemetry switch unit. A particular resistive component can be switched into the circuit path when the telemetry switch unit is in the corresponding switch position. To determine the switch position of the telemetry switch unit, the controller can determine the resistance value of the resistive component currently coupled into the signal path. This may provide a reduced pin/wire count, as only two wires may be required for each telemetry switch unit (the common input signal path and common return path).

Telemetry systems are often used to collect data from hundreds or thousands of monitored components. Each of these monitored components mat have a corresponding telemetry switch unit. As the number of monitored components increases, large and bulky wire harnesses may be required even with only two wires for each telemetry switch unit. This can result in a telemetry system of significant mass. This may be undesirable, particular in applications with size or weight limitations, such as spacecraft applications.

Embodiments described herein provide telemetry systems with telemetry switch units arranged in a matrix topology. Embodiments described herein also provide methods for determining the switch positions of the telemetry switch units in matrixed telemetry switch arrays. A matrix topology may provide significant reductions in the size and space requirements for telemetry systems, particularly where there are many monitored components. For example, a telemetry switch array with 512 switching units in a 32×16 matrix may use only 48 pins/wires to determine the switch position of all 512 switch units. If a matrix topology was not used, 513 or more pins/wires might be required. Thus, some embodiments described herein may provide for tenfold or more decreases in signal wire requirements.

A telemetry switch array using a matrix topology can include a plurality of telemetry switch units. Each telemetry switch unit can have a switch current input (i.e. a signal input) a switch current output (i.e. a signal output or return) and a plurality of switch positions.

The switch positions of a telemetry switch unit may define alternative (parallel) signal paths between the switch current input and the switch current output. The telemetry switch unit may be configured so that only one switch position can be closed at a time, i.e. so that there is only one signal path at a time between the switch current input and the switch current output of the switch unit. Accordingly, each switch position can define the current path for the switch unit as a position-specific current path.

Each position-specific current path can have a resistive component switched into the current path between the switch current input and the switch current output. The resistive component for each switch position can have a position-specific resistance value (i.e. the resistive components for each of the position-specific current paths can have different resistance values). The switch position of each telemetry switch unit may then be determined based on the position-specific resistance value currently coupled into the signal path of that telemetry switch unit.

The telemetry switch array can include a plurality of input current paths and a plurality of output current paths. Multiple telemetry switch units may share a common input signal/current path. Similarly, multiple telemetry switch units may share a common return (current output) path. However, there may be only one telemetry switch unit that is coupled to a particular combination of input current path and output current path.

Each input current path can be coupled to the switch current input of a first one or more telemetry switch units of the plurality of telemetry switch units in the telemetry switch array. Similarly, each output current path can be coupled to the switch current output of a second one or more telemetry switch units of the plurality of telemetry switch units in the telemetry switch array. Each telemetry switch unit can be coupled to one of the input current paths and one of the output current paths.

The input current paths and output current paths may be considered to correspond to rows and columns of a matrix. For example, each telemetry switch unit along a "row" of the telemetry switch array may be coupled to the same input current path. Similarly, each telemetry switch unit along a "column" of the telemetry switch array may be coupled to the same output current path. An electrical signal can be directed through a particular telemetry switch unit by electrically connecting a particular input current path (the input current path coupled to the switch current input of that particular telemetry switch unit) to an electrical signal source (e.g. a current source or voltage source) and completing the circuit through a particular output current path (the output current path coupled to the switch current output of that particular telemetry switch unit). An electrical signal can then be applied (e.g. a current signal or a voltage differential applied between the particular input current path and the particular output current path) and the resultant electrical signal can be measured across the array current path (e.g. the voltage drop as a result of the current signal or the current flow caused by the voltage differential). The applied signal and measured signal can be used to determine the resistance along the array current path.

Connecting a plurality of telemetry switch units in a matrix topology, with multiple telemetry switch units sharing common input current paths and output current paths, may cause loading effects on the telemetry switch units. Although a particular telemetry switch unit can be selected by actuating a particular input current path and output current path, there may still be multiple parallel paths for current to flow. That is, the other telemetry switch units coupled to the input current paths and output current paths may load the telemetry switch unit whose switch position is currently being interrogated. This may complicate the process of determining the switch position, as the total impedance of the telemetry switch unit may need to be considered taking into account the loading effects of all other telemetry switch units. To minimize or avoid these loading effects, isolation diodes can be used to prevent loading by the other telemetry switch units in the array.

Each telemetry switch unit can include at least one isolation diode in a current path (or signal path) between the switch current input and the switch current output. The isolation diodes can be forward-biased in each of the telemetry switch units. The isolation diodes can be positioned in the current path regardless of the switch position of the telemetry switch unit. This can minimize or prevent loading effects from current leaking through other telemetry switch units. However, the isolation diodes introduce an additional voltage drop into the current path through a telemetry switch unit. This diode voltage drop term must be accounted for when determining the switch position of that telemetry switch unit.

In some cases, multiple series and/or parallel isolation diodes may be used in one or more telemetry switch units. This may provide increased reliability, for example in case one of the diodes short-circuits. However, this further complicates determination of the switch-position, because the current through a telemetry switch unit passes through multiple diodes (with associated voltage drops) as well as the position-specific resistive component that can be used to determine the switch position.

Embodiments described herein may provide telemetry systems and methods for telemetry switch units arranged in a matrix topology that are configured to de-imbed (i.e. account for) the voltage drop caused by the isolation diodes. This may allow the switch positions of the telemetry switch units to be determined more accurately, while also minimizing loading effects of the other telemetry switch units. Some embodiments described herein may account for the voltage drop of the isolation diode(s) with minimal computational complexity.

To determine the switch position of a particular telemetry unit, a plurality of electrical sensing signals (e.g. current signal or voltage signal) can be applied through an array current path of the telemetry switch array that passes through the particular telemetry unit. The resultant electrical signal (e.g. voltage or current) across the array current path can be measured. The resultant electrical signal can be used to generate one or more signal values for the array current path. The one or more signal values can be compared to switch threshold signal values and/or threshold signal ranges to determine the switch position.

For example, to determine the switch position of a particular telemetry switch unit, a plurality of sense currents can be provided through an array current path of the telemetry switch array. The array current path can be defined to pass through the particular telemetry switch unit by actuating the corresponding input current path and output current path coupled to that telemetry switch unit (e.g. coupling a current source to the corresponding input current path and completing a circuit through the output current path). Each sense current can have a different current level.

A plurality of voltages can be measured across the array current path. Each measured voltage can correspond to one of the sense currents. The relationship between the plurality of measured voltages and corresponding sense currents is indicative of the resistive value of the resistive component coupled into the array current path at the present switch position. Accordingly, the switch position of the particular telemetry switch unit can be determined from the plurality of measured voltages. However, as mentioned, the measured voltages also reflect the voltage drop of the isolation diode through the particular telemetry switch unit. This voltage drop may need to be accounted for to determine the switch position accurately.

The plurality of measured voltages can be used to determine one or more voltage values for the array current path. The voltage values can be compared to one or more switch threshold voltages stored for the telemetry switch unit to determine the present switch position of the telemetry switch unit. The sense current levels, voltage values and switch threshold voltages can be selected to permit the switch position of the telemetry switch unit to be determined while accounting for the voltage drop of the isolation diode(s) of the switch unit.

In some embodiments, a voltage value may be determined as a voltage difference between a first measured voltage and a second measured voltage. The first measured voltage and the second measured voltage may correspond to first and second sense currents with different current levels. In some cases, the first and second sense currents are selected to have sense current levels close in value.

The voltage difference can be compared to a plurality of switch threshold voltages for the telemetry switch unit. The plurality of switch threshold voltages may define threshold voltage ranges for the telemetry switch unit. Each threshold voltage range can be associated with one of the switch positions (or its corresponding position-specific resistance value) of the telemetry switch unit. Accordingly, the threshold voltage range that corresponds to the voltage difference can be used to identify the switch position of the telemetry switch unit.

In some embodiments, a plurality of voltage values may be determined. Each voltage value may be determined based on a different measured voltage. A plurality of voltage markers can be defined by comparing each of the voltage values to one or more threshold voltages (or threshold voltage ranges) stored for the telemetry switch unit. Each voltage value can define one of the voltage markers. The switch position of the telemetry switch unit can be determined from the plurality of threshold markers.

For example, a sequence of threshold markers may be defined from the plurality of voltage markers. The switch positions of the telemetry switch unit may each correspond to a particular sequence of threshold markers. Accordingly, by defining the sequence of threshold markers, the current switch position may be determined. The number of threshold markers (as well as the number of sense currents and corresponding measured voltages) may be defined based on the number of switch positions of the switch unit being interrogated.

The order of the threshold marker sequence may be defined based on the sense currents applied through the array current path. For example, each sense current may have an increased current level as compared to the previously applied sense current. The sequence may be defined beginning from the measured voltage corresponding to the lowest sense current level to the measured voltage corresponding to the highest sense current level. The sense current levels and resistive values of the telemetry switch units may be selected to enable the voltage markers and voltage marker sequence to be generated under various operating conditions (e.g. across changes in temperature).

As a skilled reader will appreciate, embodiments described herein using sensing currents and measured voltages may be considered equivalent to analogous approaches using sensing voltages and measured currents. A plurality of sensing voltages can be applied across the array current path of the telemetry switch array and a plurality of resultant currents through the array current path can be measured. The sensing voltages and measured currents can be used to determine the current switch position of the telemetry switch unit in accordance with the embodiments described herein in a manner analogous to using sensing currents and measured voltages.

In embodiments described herein, isolation diodes may reduce the loading effects on a particular telemetry switch unit from the other telemetry switch units in a telemetry switch array. However, there may still be leakage currents that pass through the parallel paths provided by the other telemetry switch units even when using isolation diodes. These leakage currents may also vary with changes in temperature. Embodiments described herein using voltage differences may minimize the effects of loading by the other telemetry switch unit, as similar loading effects may be expected in each measured voltage that is subtracted.

The voltage drop of the isolation diodes may also change appreciably over temperature. Embodiments described herein using voltage differences may also minimize these effects, as the changes in voltage drop may be similar for the first and second sense currents applied.

Referring now to FIG. 1, shown therein is an example of a telemetry system 100 in accordance with an embodiment. Telemetry system 100 has a telemetry switch array 102 that includes a plurality of telemetry switch units 104aa-104mn. The telemetry switch units 104 are arranged in a matrix topology or configuration, with a plurality of telemetry switch units 104 in each row (a, b . . . m) and a plurality of telemetry switch units 104 in each column (a, b . . . n).

Each telemetry switch unit 104 can have a switch current input 106 and a switch current output 108. Each switch unit 104 can have a plurality of switch positions 110 and at least one isolation diode 112 in a current path 114 between the switch current input 106 and the switch current output 108 of that switch unit 104.

Each telemetry switch unit 104 may have a corresponding monitored component (e.g. an RF switch or a sensor). The switch position 110 of the telemetry switch unit 104 may be controlled by, or reflective of, the state of the monitored component. For example, a change in the RF switch position may cause a corresponding change in the switch position 110 of the corresponding telemetry switch unit 104. Similarly, a change in the data sensed by a sensor may cause a corresponding change in the switch position 110 of the corresponding telemetry switch unit 104. Accordingly, the switch position 110 of a telemetry switch unit 104 can reflect data (e.g. sensor data or operation conditions such as RF switch position) of interest from the monitored component.

Each switch position 110 may correspond to an alternative or parallel position-specific current path between the switch current input 106 and the switch current output 108. Each position-specific current path has a resistive component with a different resistance value. When closed, a switch position 110 can define the current path 114 as a position-specific current path with the corresponding resistive component coupled into the current path 114 between the switch current input 106 and the switch current output 108. The resistive component for each switch position 110 can have a different position-specific resistance value.

Although the telemetry switch units 104 in telemetry switch array 102 are shown with different numbers of switch positions (e.g. switch unit 104aa has three switch positions, switch unit 104an has four switch positions, and switch unit 104bb has two switch positions), in some cases the telemetry switch units 104 in the array may each have the same number of switch positions. Similarly, the resistance values of the resistive components may be the same across different switch units 104. This may simplify the process of determining the switch position of each switch unit 104, as the same threshold voltages and sense current levels may be used.

The telemetry switch array 102 can also include a plurality of input current paths 116 and a plurality of output current paths 118. Each input current path 116 can be coupled to the switch current input 106 of a first plurality of telemetry switch units 104. Each of the switch units 104 can have its switch current input 106 coupled to one of the input current paths 116. For example, in system 100 input current path 116 is shown coupled to the switch current inputs 106 of switch units 104aa, 104ab and 104an.

Each output current path 118 can be coupled to the switch current output 108 of a second plurality of telemetry switch units 104. Each switch unit 104 can have its switch current output 108 coupled to one of the output current paths 118. For example, in system 100 output current path 118 b is shown coupled to the switch current outputs 108 of switch units 104ab, 104bb, and 104mb.

Telemetry system 100 also includes an electrical signal source such as a current source 120. Signal source 120 may be electrically connectable to each of the input current paths 116 and output current paths 118. Telemetry system 100 may also include a signal measuring devices such as a voltmeter (not shown). The voltmeter may similarly be electrically connectable to each of the input current paths 116 and output current paths 118. The voltmeter may be configured to measure a voltage between the input current path 116 and output current path 118 currently connected to the current source 120. Alternatively, a voltage source may be used as the electrical signal source 120 in place of a in some embodiments. In such cases, an ammeter may be used in place of a voltmeter.

In general, the electrical signal source 120 can be connected to the telemetry switch array 102 to provide one or more electrical sensing signals (e.g. a sense current or a sense voltage differential) to the array current path (i.e. by electrically connecting the signal source 120 to one of the input current paths 116 and output current paths 118). A signal measuring device (e.g. a voltmeter or ammeter) can be electrically connected to the array current path to measure a resultant electrical signal (e.g. an induced voltage or induced current) of the array current path.

For simplicity, the description herein provides example embodiments of the electrical signal source 120 implemented as a current source and example embodiments of methods applying a sense current and measuring a corresponding resultant voltage. A skilled reader will appreciate, however, that the described embodiments can also be implemented using a voltage source and applying a voltage differential without deviating from the scope of the invention described herein. In general, embodiments of system 100 using a voltage source 120 may operate analogously to embodiments using a current source 120.

The electrical signal source 120 may be implemented as a single signal source that is selectively connectable to each of the input current paths 116 and output current paths 118. Alternatively, multiple electrical signal sources 120 may be used, each of which may be connectable to one or more of the input current paths 116 and output current paths 118.

The current source 120 can be operable to provide current through an array current path that is defined by the input current path 116 and output current path 118 currently connected to the current source 120. The array current path may be defined as passing from a particular input current path 116 to a particular output current path 118 through the current path of a particular telemetry switch unit 104 (i.e. the switch unit 104 coupled to both the particular input current path 116 and the particular output current path 118). For example, where the current source 120 is coupled to input current path 116b and output current path 118b, the array current path can be defined to pass through the current path 114bb of telemetry switch unit 104bb.

The current source 120 may provide a plurality of sense currents through the array current path. Each sense current may have its own, different current level. A voltmeter may be used to measure the voltage across the array current path for each of the sense currents applied.

Providing a plurality of sense currents and measuring the corresponding voltages across the array current path may enable one or more voltage values to be determined for a selected telemetry switch unit 104. This can enable the current switch position of that telemetry switch unit 104 to be determined. As mentioned above, the relationship between the plurality of sense currents and the voltage values is indicative of the resistance value of the resistive component currently switched into the current path 114.

Telemetry system 100 also includes a controller 130 coupled to the current source 120. The controller 130 may be used to control the operation of the current source 120 to apply sense currents through an array current path. The controller 130 may also be used to measure voltages resulting from the applied sense currents, and to determine switch positions of the telemetry switch units 104. The controller 130 may also determine the underlying data from the monitored component that corresponds to the determined switch position (e.g. the position of a corresponding RF switch, or the data from a corresponding sensor).

In some cases, the controller 130 may be implemented using a computer processor, such as a general purpose microprocessor. In some other cases, controller 130 may be a field programmable gate array, application specific integrated circuit, microcontroller, or other suitable computer processor, or controller. Controller 130 may also be configured to perform various methods for determining the switch position of a telemetry switch unit, such as those described below with reference to FIGS. 3-6. Processes for determining the switch position of a telemetry switch unit may be embedded in the controller device, e.g. as firmware.

The controller may also include one or more communication interfaces. A communication interface may be one or more data network interface, such as an IEEE 802.3 or IEEE 802.11 interface, for communication over a network. The controller may also include various other components such as input device(s), output device(s), and so on.

As mentioned, a single current source 120 may be used in telemetry system 100. The current source 120 may be coupled to an appropriate arrangement of switches to route current into a selected input current path 116 and out a selected output current path 118. This routing can cause current to flow through the diode and resistive component of the telemetry switch unit 104 corresponding to the input current path 116 and output current path 118. The resultant voltage across the selected input current path 116 and output current path 118 pair can then be measured and used to determine the switch position of the telemetry switch unit 104.

The controller 130 may measure a plurality of voltages across the array current path coupled to the current source 120. Each measured voltage may be associated with a sense current having a different current level. The plurality of measured voltages and corresponding sense current levels reflect the resistance value of the particular resistive component coupled into the current path through the telemetry switch unit. The controller 130 may thus determine the switch position of a telemetry switch unit from the plurality of measured voltages, e.g. by determining corresponding voltage values and comparing them to stored voltage thresholds.

The controller 130 may be configured to provide control and/or synchronization between various components of telemetry system 100, such as switches used to route current from the current source 120 to the selected input current path 116 and output current path 118 and/or to adjust the current level of the sense currents routed through the array current path.

As mentioned, the measured voltages also reflect the voltage drop caused by the isolation diodes 112. Accordingly, the controller 130 may determine the switch position of the telemetry switch units while accounting for the voltage drop caused by the isolation diode(s) 112. The controller 130 may determine the switch position of a telemetry switch unit 104 directly, without requiring the impedance of other telemetry switch units to be analyzed.

For example, the controller 130 may determine at least one voltage value for the array current path from the plurality of measured voltages. The controller 130 may determine the switch position of the telemetry switch unit 104 by comparing each voltage value to at least one switch threshold voltage for the switch unit. The voltage values, current levels and switch threshold voltages may be defined so as to minimize or eliminate error introduced by the voltage drop of the isolation diode(s) 112.

Telemetry system 100 may also include a storage component 140. Storage component 140 may generally be a computer-readable storage medium. Storage component 140 can include volatile and non-volatile memory and/or storage elements. Storage component 140 can include RAM, ROM, one or more hard drives, one or more flash drives or some other suitable data storage elements such as disk drives, etc. The storage component 140 may also be used to store an operating system and programs as is commonly known by those skilled in the art. For example, the storage component 140 may be used to store various applications usable by the controller 130.

Storage component 140 may be used to store switch threshold values (e.g. threshold voltages and threshold voltage ranges and/or threshold currents and threshold current ranges) used to determine the switch positions of a telemetry switch unit from measured voltages. Storage component 140 can also be used to store the determined switch position and corresponding data of the monitored components. The storage component 140 may also be used to store sense current levels that may be used in methods for determining the switch position of a telemetry switch units.

In general, the storage component 140 can store switch threshold values for all of the telemetry switch units 104. In some cases, the switch threshold values may be the same for one or more of the telemetry switch units 104. For example, where the telemetry switch units 104 have the same number of switch positions and corresponding position-specific resistance values, the sense current levels and switch threshold values may be defined to be the same.

The storage component 140 may also store a plurality of marker relationships. Marker relationships may define a relationship between a particular sequence of threshold markers and a particular switch position. Such marker relationships may be used in some embodiments described herein for determining the switch position of a telemetry switch unit 104.

In general, the telemetry switch array 102 may be extended to any N×M matrix. Each of the telemetry switch units 104 in the N×M array can have steering or isolation diodes in series with the resistive components for the switch positions. These diodes may prevent the resistive components of other telemetry switch units in the matrix from loading the circuit.

Figure 2:
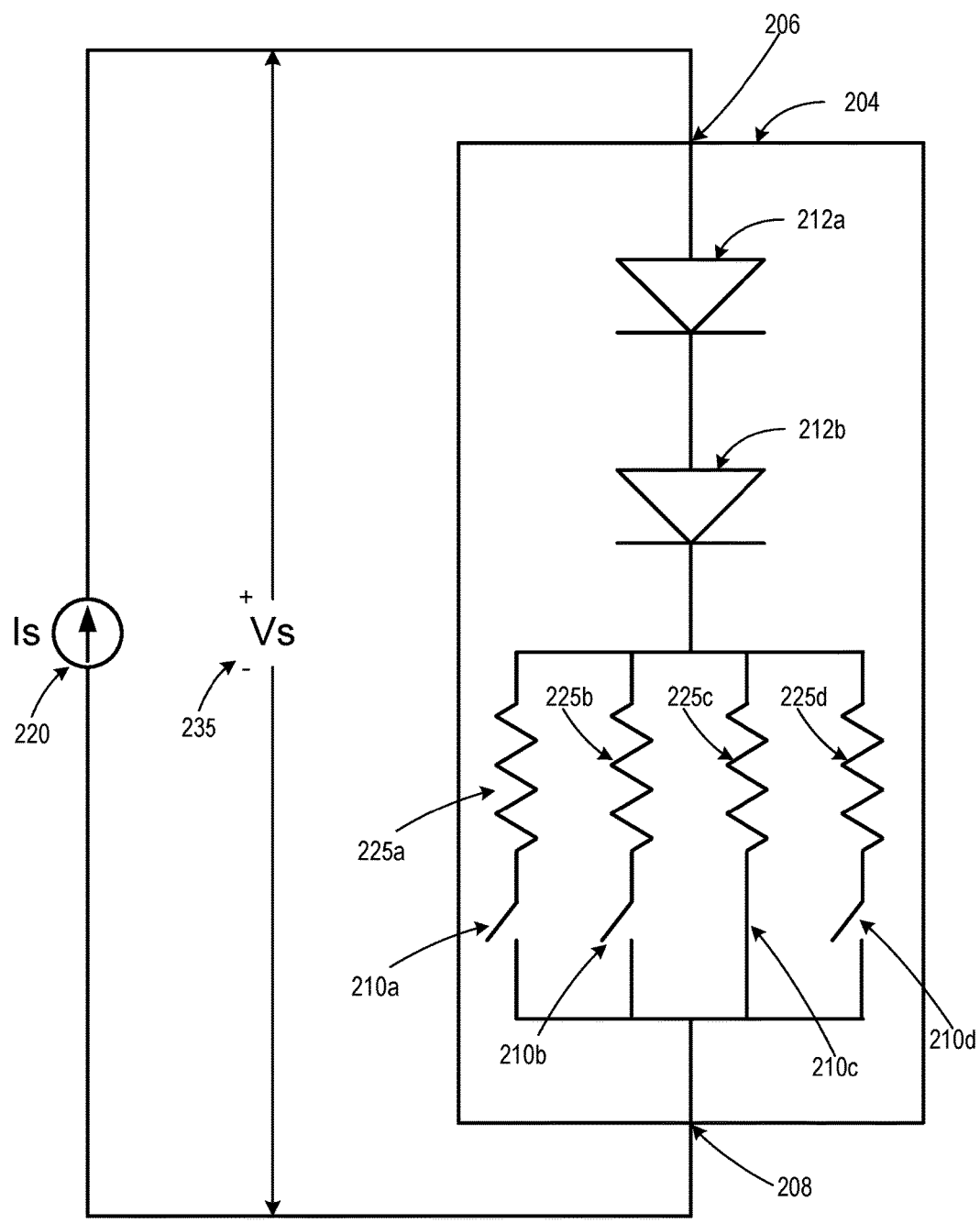
FIG. 2 illustrates an example of a telemetry switch unit in accordance with an example embodiment.

Referring now to FIG. 2, shown therein is an example of a telemetry switch unit 204 in accordance with an example embodiment. The telemetry switch unit 204 is an example embodiment of a switch unit that may be used in a telemetry system such as system 100. In general, the features and operation of telemetry switch unit 204 are similar to the switch units 104 shown in FIG. 1 and described above.

As with telemetry switch units 104, telemetry switch unit 204 includes a switch current input 206 and a switch current output 208. Telemetry switch unit 204 has four switch positions 210a-210d. Each switch position 210 has a corresponding resistive component 225a-225d. Each of the resistive components 225a-225d has a different resistive value. As with telemetry switch units 104, in telemetry switch unit 204 only one of the switch positions 210a-210d is closed at a time. Accordingly, determining the resistive value of the resistive component 225 currently coupled into the current path between the switch current input 206 and the switch current output 208 enables the current switch position 210 to be identified.

Telemetry switch unit 204 includes a pair of diodes 212a and 212b. A telemetry switch unit 204 with a plurality of diodes 212 may provide increased reliability, for instance in case of a short-circuit failure by one of the diodes 212. This may be particularly important for long-term applications, such as space applications for example.

To determine the switch position 210 of the switch unit 204, a current source 220 can be coupled to the switch current input 206 and switch current output 208. As explained with reference to FIG. 1, the current source may be coupled to switch unit 204 by electrically connecting the current source 220 to an input current path and output current path that are both connected to the switch unit 204. A plurality of sense currents can be provided through the switch unit 204. The corresponding voltage 235 may then be measured. Voltage values determined from the measured voltages can be used to determine the current switch position 210.

When current passes through switch unit 204, each of the diodes 212 has an associated voltage drop. Accordingly, to determine the switch position 210, the voltage drop of the diodes 212 may need to be accounted for to ensure the correct resistive value (or corresponding voltage/current value that reflects the resistive value) can be identified.

Figure 3:
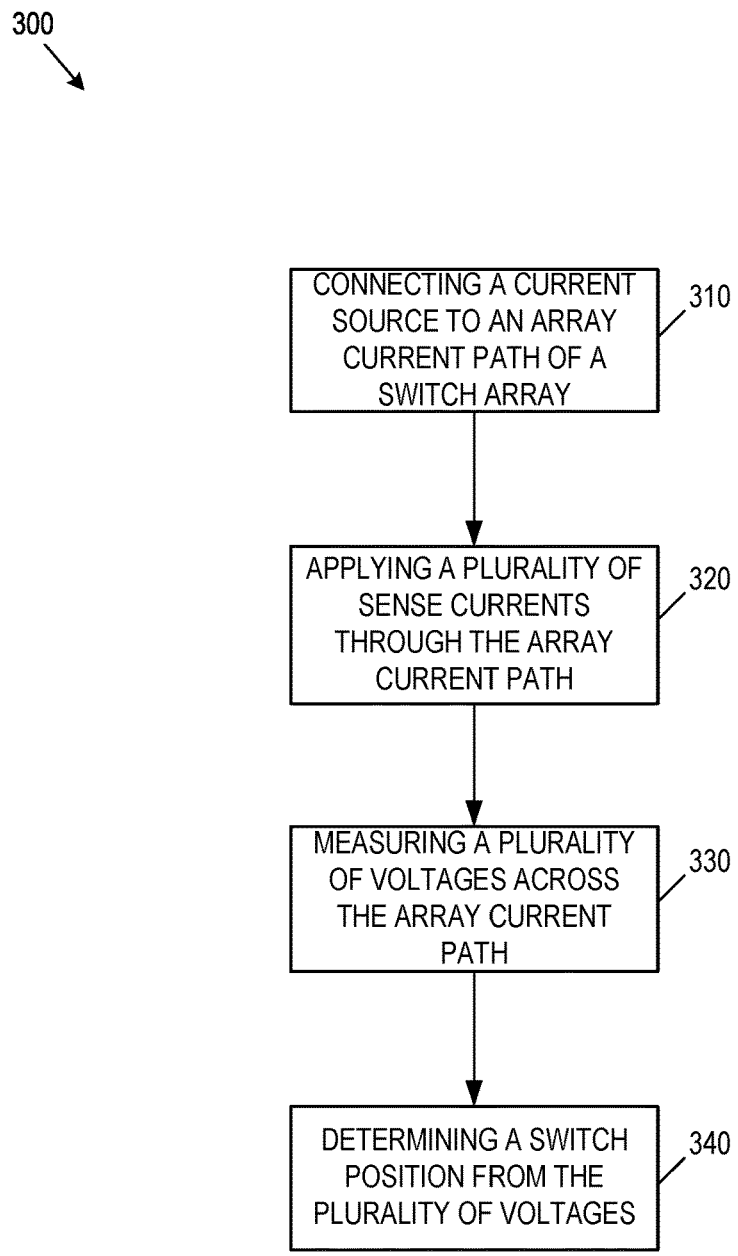
FIG. 3 illustrates an example of a process for determining a switch position in accordance with an example embodiment.

Referring now to FIG. 3, shown therein is an example process 300 for determining a switch position in accordance with an example embodiment. The process 300 may be implemented using a telemetry system with switch units in a matrix topology, such as the example telemetry system 100. Process 300 is an example process that may be used to determine the switch position of a telemetry switch unit by applying a plurality of sensing current signal and measuring the resultant voltages. As will be apparent to a skilled reader, an analogous process can also be implemented applying a plurality of sensing voltage signal and measuring the resultant currents.

Process 300 can be used to determine the switch position of a telemetry switch unit implemented in a telemetry switch matrix, such as array 102 of telemetry system 100. The telemetry switch array can include a plurality of telemetry switch units with each telemetry switch unit having a switch current input and a switch current output. Each of the switch units may have a plurality of switch positions and at least one isolation diode in a current path between the switch current input and the switch current output. Process 300 is an example process for directly determining the switch position of a telemetry switch unit while accounting for the voltage drop of the unit's isolation diode.

The array can include a plurality of input current paths with each input current path coupled to the switch current input of a first plurality of telemetry switch units from the plurality of telemetry switch units. The array can also include a plurality of output current paths with each output current path coupled to the switch current output of a second plurality of telemetry switch units from the plurality of telemetry switch units.

At 310, a current source can be connected to an array current path of the telemetry switch array. The current source may be electrically connectable to each of the input current paths and each of the output current paths. The current source may be connected to a particular input current path and a particular output current path so as to define the array current path to pass through a particular telemetry switch unit (i.e. the switch unit corresponding to the particular input current path and the particular output current path). The array current path can be so defined to provide current through the telemetry switch unit whose switch position is of interest.

The current source may be connectable to the input current paths and output current paths using a series of switches. The switches may be toggled, e.g. using controller 130, to connect the current source to the particular input current path and the particular output current path.

At 320, a plurality of sense currents can be applied or provided through the array current path defined at 310. Each sense current can have a different current level. The sense current levels may be selected based on the resistance values of the resistive components corresponding to the switch positions of the particular telemetry switch unit.

The sense currents can be provided by the current source after being electrically connected to the particular input current path and the particular output current path. The sense current can pass through the selected telemetry switch unit as it passes from the input current path to the output current path.

At 330, a plurality of voltages can be measured across the array current path. Each measured voltage may correspond to one of the sense currents applied at 320. Accordingly, each measured voltage may correspond to a different sense current level. The sense current levels can be selected at 320 so that the voltage measured across the array current path can be measurably different for each sense current level.

A voltmeter can also be electrically connected to the array current path. The voltmeter can be connected to measure the voltage difference across the array current path. The voltage difference across the array current path may substantially reflect the voltage difference caused by the telemetry switch unit of interest.

At 340, the switch position of the telemetry switch unit can be determined from the plurality of measured voltages. The plurality of measured voltages and corresponding sense current levels correspond to the resistance value of a resistive component coupled into the current path through the particular telemetry switch unit as a result of the current switch position. Accordingly, the relationship between the plurality of measured voltages and plurality of sense currents can be used to determine the current switch position.

In some embodiments, at least one voltage value can be determined for the array current path from the plurality of measured voltages. In some cases, a plurality of voltage values may be determined. The switch position of the telemetry switch unit can be determined by comparing each voltage value to at least one switch threshold voltage stored for the particular telemetry switch unit. In some cases, a plurality of switch threshold voltages may be stored for the telemetry switch unit. The plurality of switch threshold voltages may define threshold voltage ranges for the switch unit. The current switch position of the switch unit can be determined based on the threshold voltages and/or threshold voltage ranges.

In some cases, the plurality of measured voltages and plurality of sense currents can be used to determine the resistance value and the switch position can be identified from the determined resistance value. In other cases, a direct relationship between the voltages values and each of the switch positions can be stored. The plurality of measured voltages and plurality of sense currents can be used to determine one or more voltage values for the current switch position, and the switch position may be determined directly from the voltage values (i.e. without actually determining the resistance value).

Figure 4:
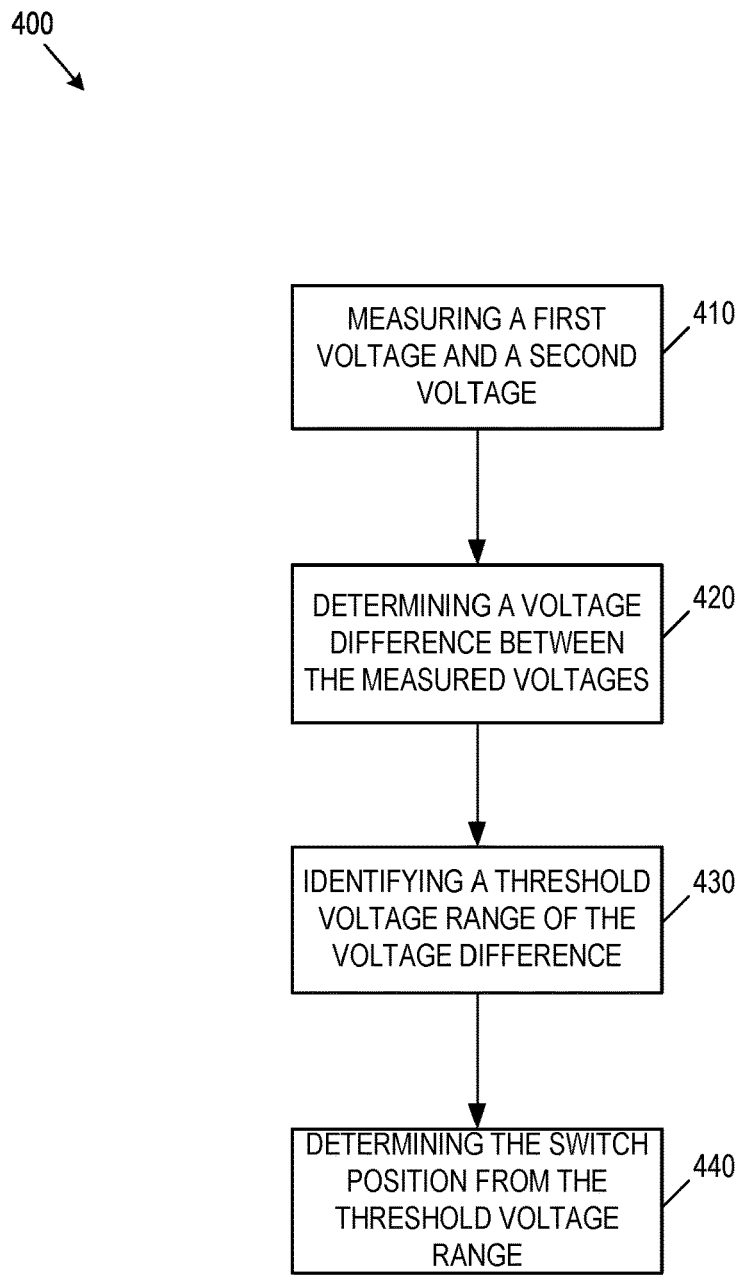
FIG. 4 illustrates another example of a process for determining a switch position in accordance with an example embodiment.

Referring now to FIG. 4, shown therein is an example process 400 for determining a switch position in accordance with another example embodiment. Process 400 is an example process that may be used to determine the switch position of a telemetry switch unit by applying a plurality of sensing current signal and measuring the resultant voltages. As will be apparent to a skilled reader, an analogous process can also be implemented applying a plurality of sensing voltage signal and measuring the resultant currents.

In process 400, a plurality of switch threshold voltages can be stored for each of the telemetry switch units. The plurality of switch threshold voltages can define a plurality of threshold voltage ranges.

In some cases, the switch threshold voltages (and corresponding threshold voltage ranges) may be the same for each telemetry switch unit. For example, each telemetry switch unit may have the same number of switch positions and resistive components with the same resistance values corresponding to each switch position. In such cases, the switch threshold voltages for each telemetry switch unit can be the same. This may facilitate manufacturing, as each telemetry switch unit can be substantially the same. This may also facilitate the process of determining the current switch position, as the loading effects on each telemetry switch unit may be substantially similar (as, for each switch unit, the other switch units in the array will be substantially similar). This may also reduce storage requirements, as the same sense current levels and voltage thresholds may be used for each telemetry switch unit.

Process 400 may be referred to herein as an example of a differential process for determining the switch position of a telemetry switch unit. A differential process may generally operate by taking two voltage measurements across the array current path for a particular telemetry switch unit at different sense current levels (or two current measurements at different sense voltage levels). The voltage value for the switch unit can then be determined as the difference between the two voltage measurements.

First and second measured voltages may be represented by the position-specific resistance value R of the resistive component coupled into the current path and the voltage drop of the isolation diode(s) $V_{diode}$ as shown in Equations 1 and 2:

$$V_1 = I_1 * R + V_{diode}(I_1) \quad (1)$$

$$V_2 = I_2 * R + V_{diode}(I_2) \quad (2)$$

where $I_1$ is a first sense current, $I_2$ is a second sense current, $V_1$ is a first measured voltage, $V_2$ is a second measured voltage, and $V_{diode}(I)$ is the forward voltage drop of the diode at the sense current I.

the current values of the sense currents $I_1$ and $I_2$ can be selected so that the two diode voltages may be considered almost equivalent:

$$V_{diode}(I_1) \approx V_{diode}(I_2) \quad (3)$$

For example, the current values of the sense currents $I_1$ and $I_2$ may be selected to be close in value to reduce the resulting diode voltage difference. In general, the selection of the sense currents may be driven by practical considerations and depend on the characteristics of the particular diodes, the accuracy of the current sources, as well as the accuracy of the voltage meter.

In some embodiments the diode voltages may be assumed to be the same for the first and second measured voltages. Subtracting Equations 1 and 2 may then be represented by Equation 4:

$$\Delta V = (V_2 - V_1) = (I_2 - I_1) * R \quad (4)$$

By subtracting the first and second measured voltages (and assuming the diode voltages are the same) the diode voltage drop may be effectively removed from the measurement. The resultant voltage difference $\Delta V$ may be unique for each resistive component R and may therefore be used to determine the switch position of the telemetry switch unit.

At 410, a plurality of voltages can be measured for a particular telemetry switch unit. The plurality of measured voltages can include a first measured voltage and a second measured voltage. The first and second measured voltage may correspond to first and second sense currents having different sense levels that are close in value.

At 420, a voltage difference between the first measured voltage and the second measured voltage can be determined. The voltage difference may be determined by subtracting the first measured voltage from the second measured voltage (or vice versa). In process 400, the at least one voltage value used to determine the switch position may be defined as the voltage difference.

At 430, a threshold voltage range corresponding to the voltage difference can be determined. A plurality of threshold voltages may be stored for each telemetry switch unit, e.g. in storage component 140. The plurality of threshold voltages can define threshold voltage ranges for that switch unit. The voltage difference can be compared with the plurality of threshold voltage to determine the corresponding threshold voltage range.

At 440, the switch position of the telemetry switch unit can be determined based on the threshold voltage range determined at 430. The threshold voltage range within which the voltage difference from 420 falls can be used to determine the switch position.

Each threshold voltage range stored for the telemetry switch unit may be defined as corresponding to a particular switch position (or the associated position-specific resistance value). Each switch position may correspond to a position-specific minimum threshold voltage and a position-specific maximum threshold voltage defining the threshold voltage range for that switch position. The determined voltage difference can be compared to these values to identify the range within which the voltage difference falls.

The voltage difference between the first and second measured voltages may be small, particularly where the first and second sense currents have close current levels. This may introduce some susceptibility to noise. A larger difference between the first and second sense current levels may reduce the impact of noise when determining the switch position of the telemetry switch unit.

A larger current difference may introduce some error, as the diode voltage drops may not be exactly equal for the first and second measured voltages. Accordingly, in some embodiments an offset term may be added to equation (4) to account for the voltage drop of the isolation diodes. This offset term may be used to set or adjust the voltage threshold levels stored for the telemetry switch unit. For example, the nominal diode voltage difference between the first and second sense currents may be used to define a voltage difference offset term. In some cases, this voltage difference offset term could be subtracted from the determined voltage difference as a correction factor. The threshold values may also be shifted by the voltage difference offset term.

In general, each of the telemetry switch units in the telemetry switch array can remain connected to their corresponding input current paths and output current paths during operation. Although current is directed through a single telemetry switch unit by actuating the corresponding row and column (i.e. input current path and output current path) there may still be multiple parallel paths through the array passing through multiple back-biased diodes. These multiple parallel paths may present a leakage path through which the sense currents may flow. The inventors have found that embodiments of the differential method described above with reference to FIG. 4 may cancel the leakage current term to some degree.

For example, when leakage currents are considered, Equations (1) and (2) may be represented as Equations (1 a) and (2a):

$$V_1 = (I_1 - I_{leak1})*R + V_{diode}(I_1 - I_{leak1}) \quad (1a)$$

$$V_2 = (I_2 - I_{leak2})*R + V_{diode}(I_2 - I_{leak2}) \quad (2a)$$

Assuming that the leakage currents and diode voltages are approximately the same for the first and second measured voltages (i.e. $V_{diode}(I_1 - I_{leak1}) \approx V_{diode}(I_2 - I_{leak2})$ and $I_{leak1} \approx I_{leak2}$) and subtracting equations 1a and 2a again results in Equation (4):

$$\Delta V = (V_2 - V_1) = (I_2 - I_1)*R \quad (4)$$

Figure 5:
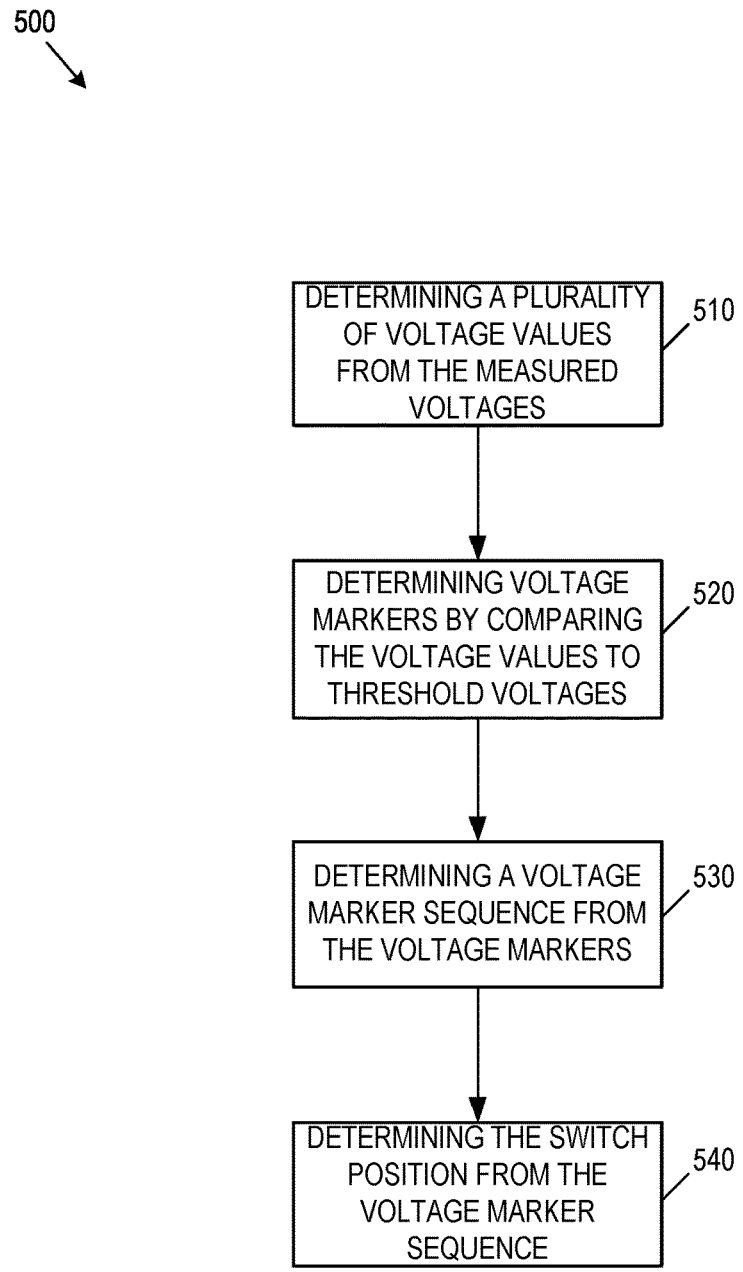
FIG. 5 illustrates a further example of a process for determining a switch position in accordance with an example embodiment.

Referring now to FIG. 5, shown therein is an example process 500 for determining a switch position in accordance with a further example embodiment. Process 500 is an example of a stepped process for determining a switch position of a telemetry switch unit. Process 500 generally describes steps that would be performed at 340 of process 300.

Process 500 is an example process that may be used to determine the switch position of a telemetry switch unit by applying a plurality of sensing current signal and measuring the resultant voltages. Process 500 may be referred to as a stepped current process. As will be apparent to a skilled reader, an analogous stepped process can also be implemented applying a plurality of sensing voltage signal and measuring the resultant currents.

In a stepped current process, the plurality of sense currents applied at 320 of process 300 include a number of different current levels that corresponds to the number of distinct switch positions of the telemetry switch unit. In turn, that same number of corresponding voltages is measured at 330 for the array current path.

At 510, a plurality of voltage values are determined. Each measured voltage defines one of the voltage values. The number of voltage values is determined to correspond to the number of switch positions of the telemetry switch unit.

At 520, a plurality of voltage threshold markers are determined from the voltage values. The threshold markers include a voltage threshold marker for each voltage value. The plurality of voltage threshold markers are determined by comparing each voltage value to the at least one threshold voltage stored for the particular telemetry switch unit. The switch position may then be determined from the plurality of voltage threshold markers.

In some embodiments, a single threshold voltage may be stored for a particular telemetry switch unit. Each voltage threshold marker may be defined based on whether the corresponding voltage value is greater than or less than the threshold voltage. An example of such an embodiment is described below with reference to FIG. 6. Alternatively, multiple threshold voltages may be stored for a switch unit. For example, the threshold voltages may define voltage ranges for a switch unit. The voltage threshold marker may then be determined based on the voltage range corresponding to the voltage value determined at 510.

At 530, a voltage marker sequence can be determined from the plurality of voltage threshold markers. Each voltage threshold marker may define one of the threshold markers in the sequence. For example, the sequence may be defined beginning from the voltage threshold marker corresponding to the lowest sense current level to the voltage threshold marker corresponding to the highest sense current level. Alternative definitions for the sequence may be used, along with corresponding modifications to marker relationships stored for the switch unit. An example process 600 for determining the threshold marker sequence is described with reference to FIG. 6 below.

At 540, the switch position of the switch unit can be determined from the voltage marker sequence. A plurality of marker relationships can be stored for each switch unit. Each marker relationship may define a relationship between a particular sequence of threshold markers and a switch position. That is, each sequence of threshold markers may correspond to a particular switch position. Accordingly, by comparing the threshold marker sequence to the marker relationships, the switch position of the telemetry switch unit may be determined.

Figure 6:
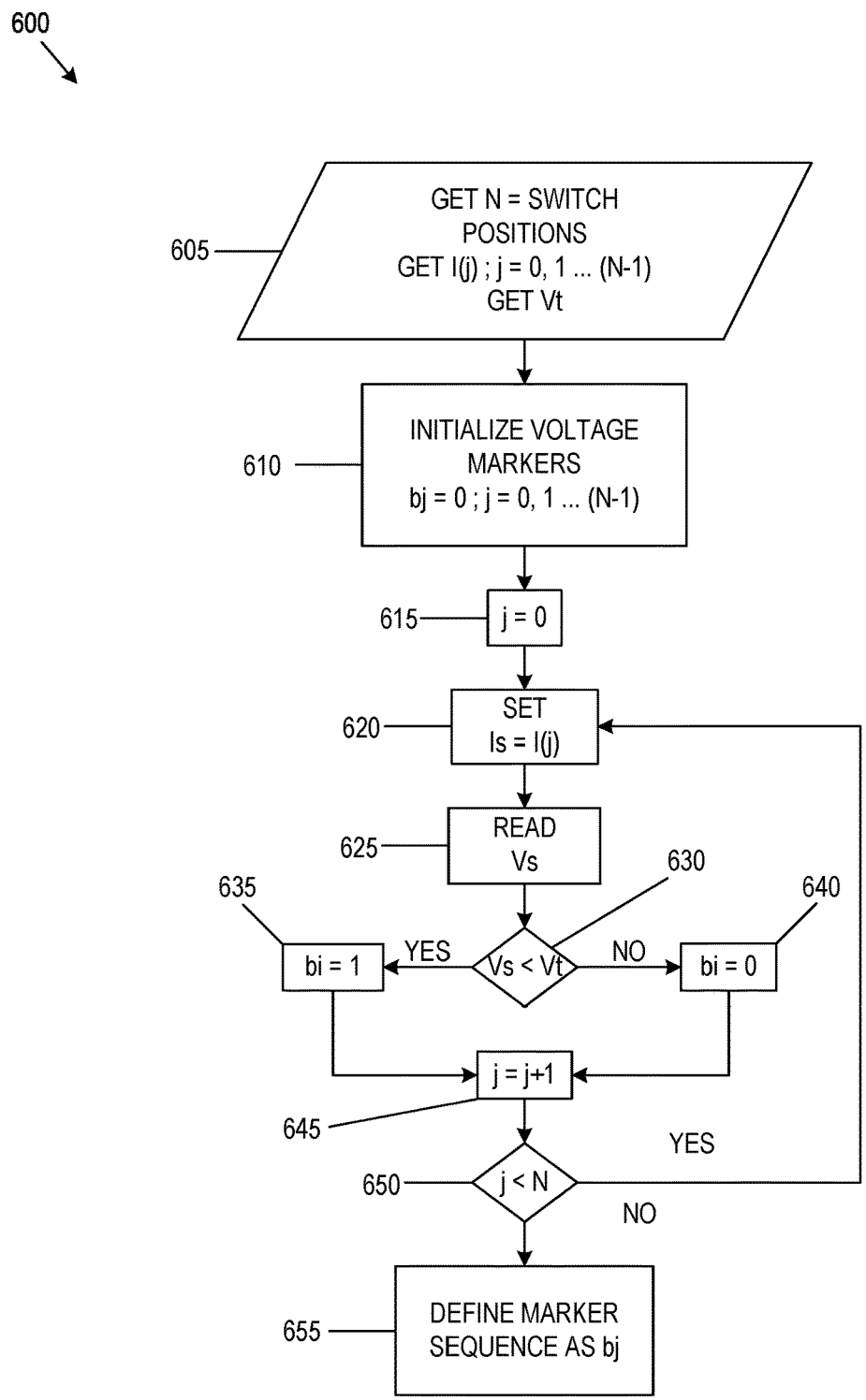
FIG. 6 illustrates an example of a process for determining a voltage marker sequence in accordance with an example embodiment.

Referring now to FIG. 6, shown therein is an example process 600 for determining a marker sequence in accordance with an example embodiment. In some embodiments, process 600 may be used as a sub-process in a process for determining the switch position of a telemetry switch unit. For example, process 600 may be implemented as part of process 500.

At 605, the number N of sense current levels (indexed by j) is set to be equal to the number of switch positions of the switch unit currently coupled into the array current path.

At 610, threshold markers b are initialized. As mentioned, the number of voltage values and corresponding threshold markers can be defined based on the number of switch positions. Accordingly, in the example of process 600 the threshold markers are also indexed using j. The sense current level and threshold marker index j is initialized to j=0 at 615.

At 620, the first sense current $I_s$ is applied through the array current path. The corresponding voltage $V_s$ is then measured at 625. The voltage $V_s$ measured at 625 is compared to a stored threshold voltage $V_t$ at 630. If the measured voltage $V_s$ is less than the threshold voltage $V_t$, then the corresponding threshold marker is set to b=1 at 635. Otherwise, the corresponding threshold marker is set to b=0 at 640. The sense current level index j, is then incremented by 1 at 645.

At 650, the index j is compared to the number of switch positions N. If the index is less than the number of switch positions, then the process returns to 620 and iterates from 620 to 650 until the number of threshold markers b is equal to the number of switch positions N. If index j is equal to the number of switch positions N, then the marker sequence is defined at 655 by the plurality of threshold markers $b_j$. The marker sequence may then be compared to a plurality of stored marker sequences or marker sequence relationships to identify the switch position of the switch unit.

In an example embodiment of process 600, a 4 bit register can used to determine the switch position. The initial value of the register can be set to $(b_3, b_2, b_1, b_0)=(0, 0, 0, 0)$. If the measured voltage Vs is less than $V_t$ then the corresponding $j^{th}$ bit of the register can be toggled to logic '1'. Once all N measurements have been made, the bit sequence in the bit register may be decoded (e.g. by comparison to stored sequences) to determine the switch position. Example bit sequences for two, three and four position switches are given in Table 1 below.

TABLE 1

Example bit sequences

| Bit Values | | | | Switch |
| --- | --- | --- | --- | --- |
| $b_3$ | $b_2$ | $b_1$ | $b_0$ | Position |
| 0 | 0 | 0 | 1 | 1 |
| 0 | 0 | 1 | 1 | 2 |
| 0 | 1 | 1 | 1 | 3 |
| 1 | 1 | 1 | 1 | 4 |

For a switch unit with only two switch positions, a bit sequence of only two bits (e.g. $b_0$ and $b_1$) may be used. Similarly, for a switch unit with three switch positions, a bit sequence of three bit (e.g. $b_0$, $b_1$ and $b_2$) may be used. For a switch unit with four switch positions, a four-bit bit sequence ($b_3$, $b_2$, $b_1$, $b_0$) can be used.

Referring again to FIG. 2, shown therein is a telemetry switch unit 204 with four switch positions 210a-210d. The resistance values of the resistive components 225a-225d, and the sense current levels can be selected to ensure that the appropriate bit sequence can be generated under most, if not all operating conditions. An example of resistance values, sense current levels and threshold voltages selected for the telemetry switch unit 204 are shown below in Table 2. Table 2 provides an example of resistance values, sense current levels and threshold voltages selected for a telemetry switch unit having two diodes 212 connected in series with a nominal diode drop of about 0.9V each.

The resistance values of the resistive components 225a-225d may be set so that each resistance value is scaled by about two times as compared to the next closest lower resistance value. That is, each position-specific resistance value is about two times greater than the value of the next lowest position-specific resistance value. For example, the resistance values of the resistive components 225a-225d may be set to 1.18K, 2.37K, 4.75K and 9.53K respectively.

The sense current levels may also be scaled or stepped in a similar manner. For example, the first sense current level may be set to 0.25 mA and a first corresponding voltage Vs across the array current path can be measured. The first measured voltage can be used to define a voltage value which is compared to a threshold voltage $V_t$. In the example shown in Table 2, the threshold voltage $V_t$ is defined as 4.8 V. If the voltage value is less than 4.8V, then the first bit threshold marker $b_0$ can be set to 1, otherwise $b_0$ is left set to 0. This process repeats with the sense current level progressively doubled (set to 0.5 mA, 1 mA and 2 mA). The corresponding voltages can be measured, used to define voltage values and compared to the threshold voltage to define the remaining bit threshold markers ($b_1$, $b_2$ and $b_3$). The sequence of bit threshold markers ($b_0$, $b_1$, $b_2$, $b_3$) can be compared to stored bit sequence relationships identifying the correspondence between a particular sequence and switch position, as shown in Table 2.

TABLE 2

Example Implementation of a Four Position Switch

| Resistive Component | $I_s$ [mA] | $V_s$ [V] | | | | Threshold marker bits (1 if $V_s < V_t$ else 0) | | | | Switch Position |
| --- | --- | --- | --- | --- | --- | --- | --- | --- | --- | --- |
| | | 0.25 | 0.50 | 1.00 | 2.00 | $b_0$ | $b_1$ | $b_2$ | $b_3$ | |
| $R_{225a}$ | 9.53K | 4.18 | 6.57 | 11.33 | 11.41 | 1 | 0 | 0 | 0 | 1 |
| $R_{225b}$ | 4.75K | 2.99 | 4.18 | 6.55 | 9.19 | 1 | 1 | 0 | 0 | 2 |
| $R_{225c}$ | 2.37K | 2.39 | 2.99 | 4.17 | 6.54 | 1 | 1 | 1 | 0 | 3 |
| $R_{225d}$ | 1.18K | 2.10 | 2.39 | 2.98 | 4.16 | 1 | 1 | 1 | 1 | 4 |

As will be apparent to one skilled in the art, the particular selection of resistance values, current levels and voltage thresholds may vary while still providing analogous functionality. In some cases, the measuring device (e.g. voltmeter or ammeter) used to measure the resultant signal may have a limited range (e.g. 5V for the example implementation shown in Table 2). Accordingly, some of the measured resultant electrical signals may over range the measuring device. Nonetheless, embodiments of the stepped processes described herein may still provide accurate results, as the values that are outside the range may be known to be within a certain threshold signal range. For instance, in the example implementation described in Table 2, values outside of the 5V range would be above the threshold voltage of 4.8V and the corresponding threshold marker bit could be set to 0.

In some embodiments, each of the telemetry switch units in a matrixed telemetry switch array may have the same set of resistive components representing the switch position of the telemetry switch unit. This may facilitate manufacturing, by providing a common build for each switch unit (particularly where the switch unit may be incorporated into the monitored component).

Embodiments described herein provide systems and methods for implementing resistive telemetry with a matrix topology. The switch positions of a telemetry switch unit in a telemetry matrix may be determined directly without computing the loading effects of the other switch units in the matrix.

Embodiments described herein may de-embed the resistance attributable to position-specific resistive components while de-embedding resistance from matrix artifacts and isolation diodes. The embodiments described herein may enable electric resistance feedback to be sensed from large numbers of remote monitored components using matrix connectivity which can reduce wire mass. Such embodiments may be suitable for reducing the mass of satellite communication RF payloads that are driven by increasing numbers of devices using historical resistive telemetry. For example, some embodiments may be implemented in an electronic switch controller used to drive RF switches in a switching network onboard spacecraft.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative and non-limiting and it will be understood by persons skilled in the art that other variants and modifications may be made without departing from the scope of the invention as defined in the claims appended hereto.

The invention claimed is:

1. A method for determining a particular switch position of a particular telemetry switch unit within a telemetry switch array that includes a plurality of telemetry switch units, each telemetry switch unit having a switch current input, a switch current output, a plurality of switch positions and at least one isolation diode in a current path between the switch current input and the switch current output, the array including a plurality of input current paths with each input current path coupled to the switch current input of a first plurality of telemetry switch units from the plurality of telemetry switch units, and a plurality of output current paths with each output current path coupled to the switch current output of a second plurality of telemetry switch units from the plurality of telemetry switch units, the method comprising:
   a) electrically connecting an electrical signal source to a particular input current path from the plurality of input current paths and to a particular output current path from the plurality of output current paths, the particular input current path being electrically connected to the switch current input of the particular telemetry switch unit and the particular output current path being electrically connected to the switch current output of the particular telemetry switch, wherein an array current path is thereby defined from the particular input current path to the particular output current path through the current path of the particular telemetry switch unit;
   b) electrically connecting a signal measuring device to the array current path;
   c) applying, by the electrical signal source, a plurality of electrical sensing signals to the array current path, each electrical sensing signal having a different signal level;
   d) measuring, by the signal measuring device, a plurality of resultant electrical signals across the array current path, each measured resultant electrical signal corresponding to one of the electrical sensing signal; and
   e) determining, by a controller, the particular switch position of the particular telemetry switch unit from the plurality of measured resultant electrical signal, wherein the plurality of measured resultant electrical signals correspond to a resistance value of a resistive component coupled into the current path through the particular telemetry switch unit.

2. The method of claim 1, wherein determining the particular switch position comprises:
   a) determining at least one signal value for the array current path from the plurality of measured resultant electrical signals; and
   b) determining the particular switch position by comparing each signal value to at least one switch threshold signal value stored for the particular telemetry switch unit.

3. The method of claim 2, wherein the at least one switch threshold signal value stored for the particular telemetry switch unit includes a plurality of switch threshold signal value defining a plurality of threshold signal ranges, and the method further comprises:
   a) measuring the plurality of measured resultant electrical signals to include a first measured resultant electrical signal and a second measured resultant electrical signal;
   b) determining the at least one signal value as a signal difference between the first measured resultant electrical signal and the second measured resultant electrical signal;
   c) identifying a particular threshold signal range by comparing the signal difference to the plurality of switch threshold signal values stored for the particular telemetry switch unit; and
   d) determining the particular switch position as a switch position corresponding to a position-specific resistance value that corresponds to the particular threshold signal range.

4. The method of claim 2, further comprising:
   a) determining the at least one signal value to include a plurality of signal values, with each measured resultant electrical signal defining one of the signal values;
   b) defining a plurality of signal threshold markers by comparing each signal value to the at least one threshold signal value stored for the particular telemetry switch unit, the plurality of signal threshold markers including a signal threshold marker for each signal value; and
   c) determining the particular switch position from the plurality of signal threshold markers.

5. The method of claim 4, further comprising:
a) determining a threshold marker sequence from the plurality of signal threshold markers, with each signal threshold marker defining one of the threshold markers in the sequence; and
b) determining the particular switch position using the threshold marker sequence and a plurality of stored marker relationships, with each marker relationship defining a relationship between a particular sequence of threshold markers and a switch position.

6. The method of claim 4, wherein the number of measured resultant electrical signal in the plurality of measured resultant electrical signal corresponds to the number of switch positions of the particular telemetry switch unit.

7. A telemetry system comprising:
a) a telemetry switch array comprising
  i) a plurality of telemetry switch units, each telemetry switch unit having a switch current input, a switch current output, a plurality of switch positions and at least one isolation diode in a current path between the switch current input and the switch current output, each switch position defining the current path as a position-specific current path with a resistive component coupled into the current path between the switch current input and the switch current output, the resistive component for each switch position having a position-specific resistance value;
  ii) a plurality of input current paths, each input current path coupled to the switch current input of a first plurality of telemetry switch units from the plurality of telemetry switch units, and the switch current input of each telemetry switch unit coupled to one of the input current paths; and
  iii) a plurality of output current paths, each output current path coupled to the switch current output of a second plurality of telemetry switch units from the plurality of telemetry switch units, and the switch current output of each telemetry switch unit coupled to one of the output current paths;
b) an electrical signal source electrically connectable to each of the input current paths and each of the output current paths, the electrical signal source being operable to provide a plurality of electrical sensing signals to an array current path defined from a particular input current path to a particular output current path through the current path of a particular telemetry switch unit; and
c) a controller operable to:
  i) measure a plurality of resultant electrical signals across the array current path, each measured resultant electrical signal associated with an electrical sensing signal having a different signal level; and
  ii) determine the switch position of the particular telemetry switch unit from the plurality of measured resultant electrical signals, the plurality of measured resultant electrical signals corresponding to a particular resistance value of a particular resistive component coupled into the current path through the particular telemetry switch unit.

8. The system of claim 7, wherein
a) the system further comprises a storage component storing at least one threshold signal value, with each telemetry switch unit having a corresponding at least one switch threshold signal value in the at least one threshold signal value; and b) the controller is operable to determine the switch position by:
  i) determining at least one signal value for the array current path from the plurality of measured resultant electrical signals; and
  ii) determining the switch position by comparing each signal value to the at least one switch threshold signal value for the particular telemetry switch unit.

9. The system of claim 8, wherein:
a) the at least one switch threshold signal value corresponding to the particular telemetry switch unit comprises a plurality of switch threshold signal values defining a plurality of threshold signal ranges with each threshold signal range corresponding to one of the position-specific resistance values for the particular telemetry switch unit; and
b) the controller is operable to:
  i) measure the plurality of measured resultant electrical signals to include a first measured resultant electrical signal and a second measured resultant electrical signal;
  ii) determine the at least one signal value as a signal difference between the first measured resultant electrical signal and the second measured resultant electrical signal;
  iii) identify one of the threshold signal ranges by comparing the signal difference to the plurality of switch threshold signal values stored for the particular telemetry switch unit; and
  iv) determine the switch position as a particular switch position corresponding to the particular position-specific resistance value that corresponds to the identified threshold signal range.

10. The system of claim 8, wherein the controller is operable to
a) determine the at least one signal value to include a plurality of signal values, with each measured resultant electrical signals defining one of the signal values;
b) define a plurality of signal threshold markers by comparing each signal value to the at least one threshold signal value stored in the storage component, the plurality of signal threshold markers including a signal threshold marker for each signal value; and
c) determine the switch position from the plurality of signal threshold markers.

11. The system of claim 10, wherein
a) the storage component stores a plurality of marker relationships, each marker relationship defining a relationship between a particular sequence of threshold markers and a particular switch position; and
b) the controller is operable to
  i) determine a threshold marker sequence from the plurality of signal threshold markers, with each signal threshold marker defining one of the threshold markers in the sequence; and
  ii) determine the switch position as one of the particular switch positions using the threshold marker sequence and the stored marker relationships.

12. The system of claim 10, wherein controller is operable to measure the plurality of measured resultant electrical signals to include a number of measured resultant electrical signals that corresponds to the number of switch positions of the particular telemetry switch unit.

13. The system of claim 10, wherein the position-specific resistance values for the particular telemetry switch unit are defined so that each position-specific resistance value is about two times or greater than the value of the next lowest position-specific resistance value.

14. The system of claim 7, wherein at least one of the telemetry switch units comprises a plurality of isolation diodes in the current path.

15. The system of claim 7, wherein for each telemetry switch unit, the position-specific resistance values corresponding to the plurality of switch positions are the same.

* * * * *